United States Patent [19]

McIntosh

[11] Patent Number: 4,777,565
[45] Date of Patent: Oct. 11, 1988

[54] SHIELDED EQUIPMENT ENCLOSURE

[75] Inventor: Rennie F. McIntosh, Cumbernauld, Scotland

[73] Assignee: Unisys Corporation, Blue Bell, Pa.

[21] Appl. No.: 23,017

[22] Filed: Mar. 6, 1987

[30] Foreign Application Priority Data

Mar. 15, 1986 [GB] United Kingdom ............... 8606439

[51] Int. Cl.$^4$ ............................................. H05K 9/00
[52] U.S. Cl. ..................................... 361/424; 174/35; 312/2; 312/257 SK
[58] Field of Search ................... 174/32, 35 R, 35 MS, 174/51; 220/4 R, 4 F, 4 C, 76, 84; 312/108, 257 SK; 361/390–391, 395, 399, 424, 428–429

[56] References Cited

U.S. PATENT DOCUMENTS 4,662,967 5/1987 Bogan et al. ..................... 174/35 R

FOREIGN PATENT DOCUMENTS 0090539 10/1983 European Pat. Off. ............ 361/424
2044545 10/1980 United Kingdom .
2138213 10/1984 United Kingdom .

*Primary Examiner*—J. R. Scott
*Assistant Examiner*—Gregory D. Thompson
*Attorney, Agent, or Firm*—Mark T. Starr

[57] ABSTRACT

An equipment enclosure comprises a frame, a top panel, two side panels, front and rear panels, and front and rear base panels. The side panels are held on the frame using studs fitted into recesses in the frame. The top cover rests on a top face of the frame and engages the studs to position the side panels relative to the frame. The front and rear panels are affixed respectively to a front edge and a rear edge of the top panel and affixed at their respective lower ends by the front base panel and the rear base panel. The tolerances are such that outside dimensions of the enclosure are entirely defined by the mutual engagement between the panels and the frame can occupy a range of positions within the completed enclosure. Each panel is coated with a conducting layer electrically connected to the frame by conducting gaskets providing electromagnetic shielding. Tip portions of the panels provide labyrintine paths between all points at the same electrical potential as the frame. The panels themselves are made of insulating material, thus prevent electrostatic discharge.

11 Claims, 4 Drawing Sheets

SHIELDED EQUIPMENT ENCLOSURE

BACKGROUND OF THE INVENTION

The present invention relates to an enclosure for electronic data processing equipment which is resistant to electrostatic discharge and in which the enclosed electronic equipment is resistant to either being disrupted in its operation by electromagnetic radiation or itself radiating significant amounts of electromagnetic energy.

Electronic and data processing equipment is generally enclosed in an equipment enclosure including a support frame surrounded by panels. The mechanical strength of the enclosure is imparted by the frame. Modern office environments where data processing electronic equipment is often found, generate large amounts of static electricity. In such environments, a static discharge from the enclosure can cause disruption of the operation of the enclosed electronic equipment.

Electromagnetic radiation is also a problem. Regulations require that electronic equipment not radiate significant amounts of electromagnetic energy, thus avoiding pollution of the radio spectrum. The equipment itself must be resistant to the incidence of electromagnetic energy thereby, allowing the equipment to be operated close to other equipment and in the presence of radio frequency radiating sources.

The requirements of resistance to static discharge and electromagnetic shielding are at odds with one another. Resistance to electrostatic discharge requires that the equipment enclosure be substantially non-conductive. On the other hand, electromagnetic shielding requires that the equipment enclosure be very highly conductive.

SUMMARY OF THE INVENTION

The present invention resides in an equipment enclosure comprising: an electrically conductive frame having first and second faces in abutment along a common edge; a first panel on the first face having an electrically conductive inner surface electrically connected to the frame and an electrically insulating outer surface; a second panel on the second face having an electrically conducting inner surface electrically connected to the frame and an electrically insulating outer surface; a tip portion on the first panel proximate to the common edge; and a tip portion on the second panel proximate to the common edge; where the tip portion of the first panel and the tip portion of said second panel cooperate to provide an extended labyrinthine path over insulating material between those portions of the enclosure electrically at the same potential as the frame and the outer surfaces of the panels.

An equipment enclosure according to the present invention is made where tolerance build up on the frame does not prevent mounting of the panels. The outer dimensions of the case or enclosure are determined by the interaction between the panels, rather than by the interaction between each panel and its mounting point on the frame.

It is a preferred feature of the present invention that all panels be in contact with the frame by means of elastic members such as gaskets, thereby allowing further movement between the panel and the frame while maintaining mechanical contact.

In the preferred embodiment of the present invention, the frame has a pair of side panels mounted on catches which allow those side panels a degree of freedom of movement relative to the frame. A top panel is placed upon a top face of the frame and the side panels contact the edges of the top panel to define the width of the enclosure. Thereafter, front and rear panels are attached, first to the front and rear edges of the top panel and then to the frame. In the preferred embodiment, the front and rear panels are attached to the frame by means of respective front and rear based panels. The latter panels engage a lower edge respectively of the front and rear panels and are in turn attached to the frame by a releasable locking mechanism. In the preferred embodiment, the top panel can thus have dimensional tolerance with respect to the frame in a forward and backward direction as well as in a side-to-side direction.

In the preferred embodiment, the top, side, front and rear panels are coated on their interior surfaces with a conductive layer which preferably comprises nickel paint, but which may be any thin conducting material. The gaskets are all conducting gaskets preferably fabricated from carbon loaded rubber or elastomer, but equally well may be made of any pliable conducting material. The gaskets are in electrical contact with the conducting layer in each panel and with the frame so that the frame and the conducting panels are electrically connected with no cracks or openings capable of radiating or receiving energy.

In the preferred embodiment, the panels on the top, side, front and rear of the enclosure are made from highly non-conductive material such as glass reinforced polyester. Each panel includes a tip portion having an edge which engages a complementary tip portion on each abutting panel. The tip portions cooperate to ensure that a labyrinthine path exists between any point outside of the enclosure and any point, such as the frame, which is at the main interior electrical potential of the enclosure.

Also in the preferred embodiment, where an exposed region of the frame is not surrounded by the conductive coating on any panel, the tip portions form a double shield including a labyrinthine path where no straight line path exists from outside the enclosure to the exposed region and where one shielding portion surrounds another.

In the preferred embodiment, the conductive gaskets not only provide slot-free electrical sealing of the enclosure against electromagnetic radiation but also allow for the take up of mechanical tolerances in the frame.

Also in the preferred embodiment, the labyrinthine path provided by the tip portions of each panel serve not only to halt electrostatic discharge but also provide mechanical tolerance between the individual panels of the enclosure.

BRIEF DESCRIPTION OF THE DRAWINGS

The invention is further explained, by way of an example, by the following description which should be read in conjunction with the appended drawings, in which.

DETAILED DESCRIPTION OF THE INVENTION

Figure 1:
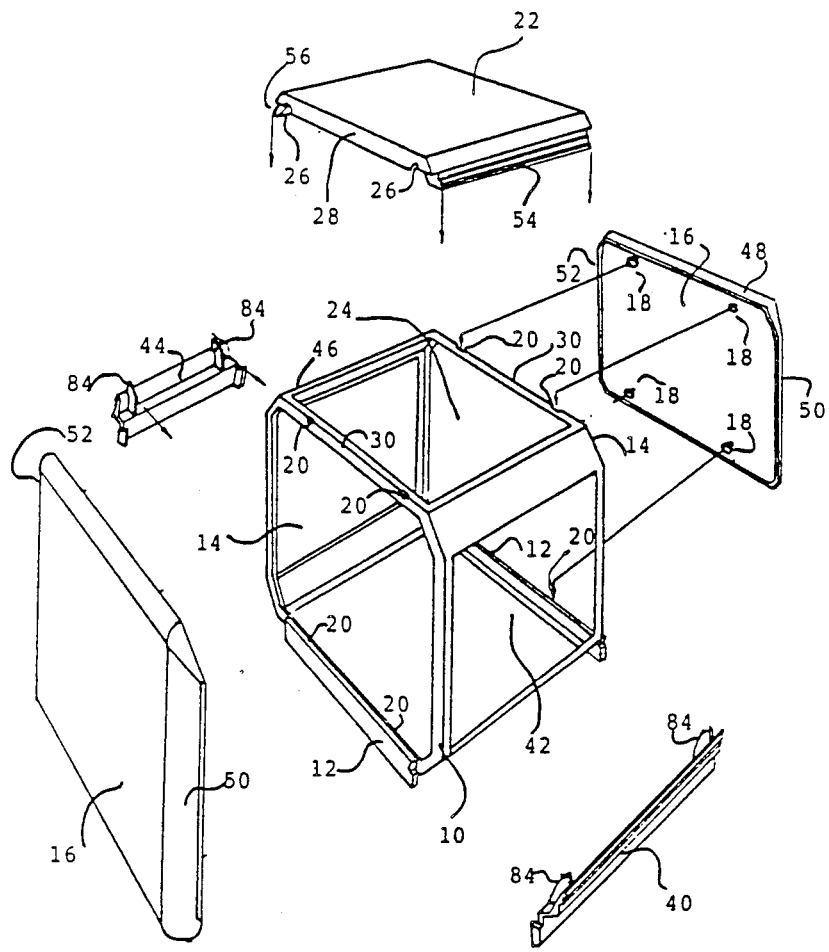
FIG. 1 shows an exploded projected view of an equipment enclosure according to the present invention with all except the front and rear panels present.

FIG. 1 shows an exploded view of a preferred embodiment of an equipment enclosure according to the present invention, the enclosure lacking only front and rear panels.

A frame 10 is fitted on either side with a side base panel 12 at the lower edge of a side face 14. The frame 10 is generally made from bent sheet steel or other metal. The frame 10 is thus a conductive frame. Equally, the frame 10 could be made from nonconducting material such as molded plastic provided an electrically conductive coating is applied thereto. Such a coating can be electro deposited metal. Equally, if the frame 10 is made generally from a plastic material, the frame 10 can be loaded with conducting particles such as carbon or metal to cause the frame 10 to be conductive.

A side panel 16 is provided to cover each side face 14 of the frame 10. The side panels 16 are provided with studs 18 which fit into complementary recesses 20 in the open framework of the frame 10. Although in the preferred embodiment there are shown to be four such studs 18 and recesses 20 associated with each side face 14 of the frame 10, it is to be appreciated that fewer or more than four studs 18 can be used.

A top panel 22 is positioned upon a top face 24 of the frame 10. Cut-away portions 26 on oppose side edges 28 of the top panel 22 straddle the studs 18 when the enclosure is assembled (in a manner described later in relation to FIG. 2) to allow movement of the side panels 16 in a direction towards and away from the side faces 14 of the frame 10.

When the enclosure is assembled, the side edges 28 of the top panel 22 project down between the top side edges 30 of the frame 10 and the side panels 16. The side edges 28 of the top panel 22 are given a generally tapered outline in cross section, with increasing thickness with increasing height. There is one side edge 28 of the top panel 22 on each side of the frame 10. The side edges 28 therefore overhang the frame 10 when the top panel 22 is in place.

Figure 2:
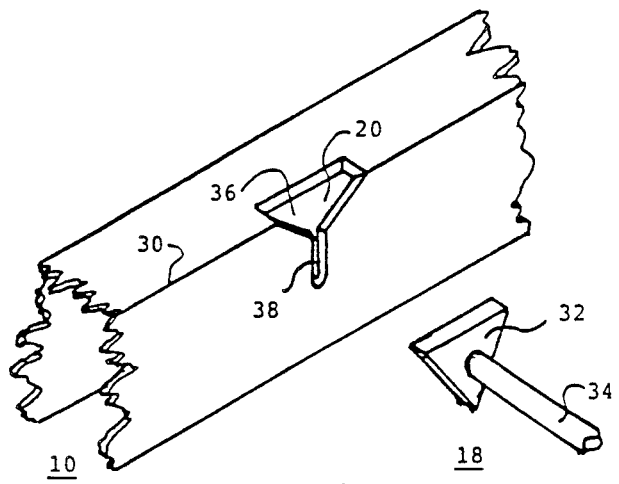
FIG. 2 shows an example of a catch suitable for attaching the side panels of FIG. 1 to the frame of FIG. 1.

Referring to FIG. 2, which shows a stud 18 and recess 20 suitable for use in the invention, the stud 18 comprises a head 32 on a shank 34.

The top side edge 30 of the frame 10, which is generally reconstructed from bent steel sheet, has a pair of recesses 20 formed therein. The recess 20 comprises a recess opening 36 designed to accept and roughly centralize the head 32 of the stud 18. A channel 38 in the lower half of the recess 20 accepts the shank 34 of the stud 18 and allows the shank 34 free movement over a range of positions within the channel 38. While the head 32 of the stud 18 is shown as being of triangular outline, it is to be appreciated that many other shapes will work. In general terms, a circular or rectangular head 32 may be provided. Likewise, the opening 36 of the recess 20 may be made wider than the head 32 of the stud 18 to accommodate a degree of mismatching between the position of the stud 18 on the side panel 16 and the position of the recess 20 on the frame 10. Similarly, the channel 38 can be made much wider than the shank 34 of the stud 18, again to accommodate such mismatching. When the top panel 22 is in position, the cut-away portions 26 thereof pass around the shank 34 of the stud 18 to define the position of the side panel 16 in relation to the top panel 22 without reference to the position of the frame 10.

Figure 5:
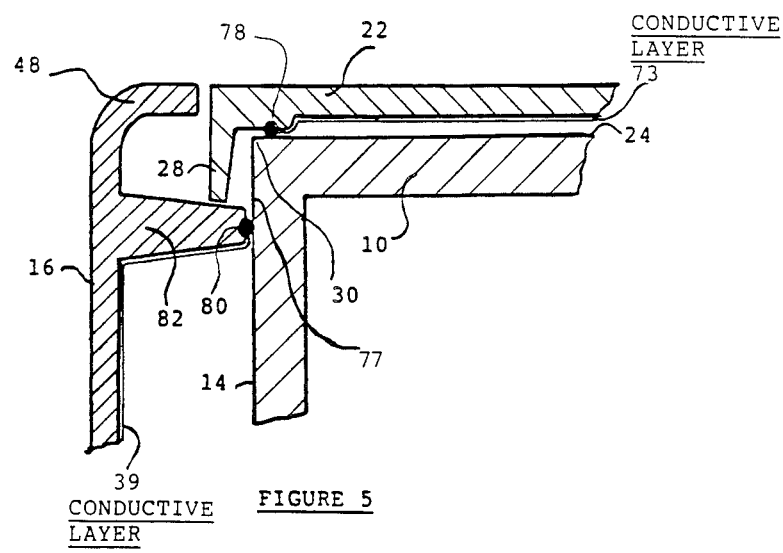
FIG. 5 is a cross-sectional view showing the relationships of the top panel a side panel, and the frame when the enclosure is in an assembled condition.

Referring again to FIG. 1, the side panel 16 is provided on its inner surface with a conducting layer 39 (FIG. 5). As will be described, the conducting layer 39 provides an electromagnetic shield for the enclosure. The studs 18 may be electrically conductive and in electrical contact with the conducting layer 39, thus ensuring continuity of electrical conduction across the entire inner face of the side panel 16 and also providing electrical contact between the conducting layer 39 and the frame 10.

A front base panel 40 is applied to a bottom edge of a front face 42 of the frame 10, and a rear base panel 44 is applied to the bottom edge of a rear face 46 of the frame 10, each in a manner to be described later.

During assembly, the side panels 16 are first applied with the studs 18 in the recesses 20 loosely held against the side face 14 of the frame 10. The top panel 22 is then placed upon the top face 24 of the frame 10 and remains there under the influence of gravity. In being placed upon the top face 24, the side edges 28 of the top panel 22 pass between upper edge portions 48 of the side panel 16 and the top side edges 30 of the frame 10. Top panel 22 moves the side panel 16 away from the side faces 14 of the frame 10 until it is seated on the top face 24 of the frame 10, with one of the side edges 28 of the top panel 22 on either side of the top side edges 30 of the frame 10. The wedge shape of the side edges 28 of the top panel 22 ensure a snug fit no matter what the dimensional tolerances of the frame 10. The cut-away portions 26 in the top panel 22 engage the shanks 34 of the studs 18 in the side panels 16 and thus cause the side panels 16 to move such that the shanks 34 of the studs 18 become centralized in the cut-away portions 26 of the top panel 22. Thus, the side panel 16 and the top panel 22 move into a mutually correct positional relationship despite any mechanical tolerances present upon the frame 10.

When the side panels 16 of the enclosure are in place, a front edge portion 50 of each side panel 16 extends beyond the front face 42 of the frame 10 and a rear edge portion 52 of each side panel 16 extends beyond the rear face 46 of the frame 10.

When the top panel 22 is in place over the top face 24 of the frame 10, a front edge 54 of the top panel 22 overhangs the front face 42 of the frame 10 and a rear edge 56 of the top panel 22 overhangs and extends beyond the rear face 46 of the frame 10.

While frame 10 is here described as being generally constructed of bent sheet metal, it can equally well be made from solid meal or plastics or any other materials.

Figure 3:
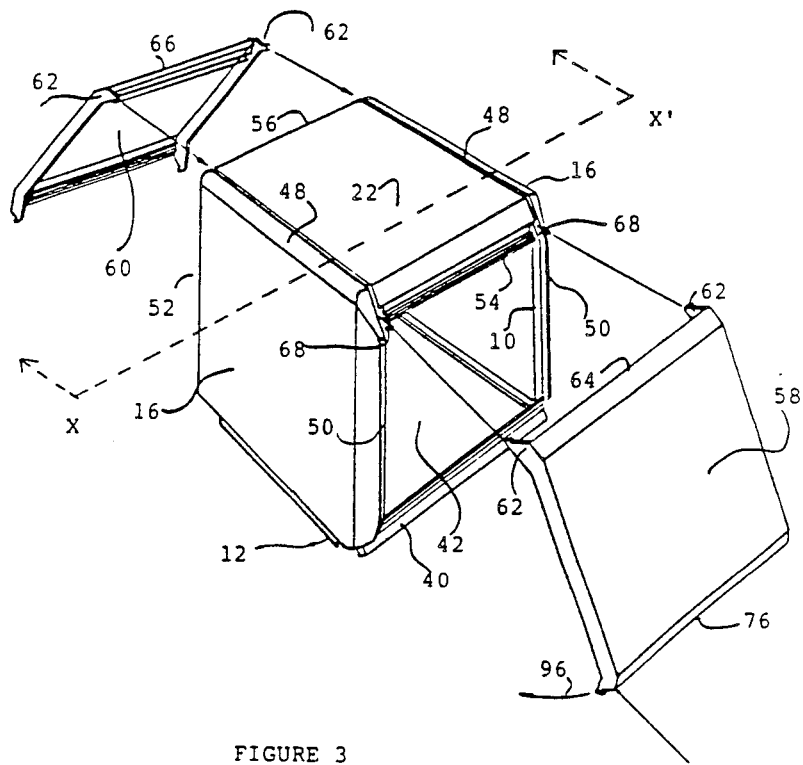
FIG. 3 shows the elements of FIG. 1 assembled and further shows the manner of addition of the front and rear panels.

FIG. 3 shows the elements of FIG. 1 assembled onto the frame 10 as described and further shows a front panel 58 and a rear panel 60 ready for placement.

The top panel 22 traps the studs 18 in the recesses 20 and prevents removal of the side panel 16 while the top panel 22 is in place.

The front panel 58 and the rear panel 60 each include arms 62,64,66. The arms 62 are provided on either side of the front 58 and rear 60 panels and fit into a gap 68 between the front edge 54 of the top panel 22 and the front edge portions 50 of the side panel 16. The arms 62 together with a staircase structure (to be described later with reference to FIG. 4) hold the front panel 58 onto the front edge 54 of the top panel 22.

The rear panel 60 is similarly attached to the rear face 46 of the frame 10 by attachment to the rear edge 56 of the top panel 22.

When in place, the upper surface of the top panel 22 is substantially at the same level as the uppermost part of the top edge portion 48 of each side panel 16. Likewise, it is intended that the outer surface of each of the front 58 and rear 60 panels should be substantially level with the most extreme part of each of the front edge portions 50 and rear edge portions 52 of the side panels 16 respectively.

Figure 4:
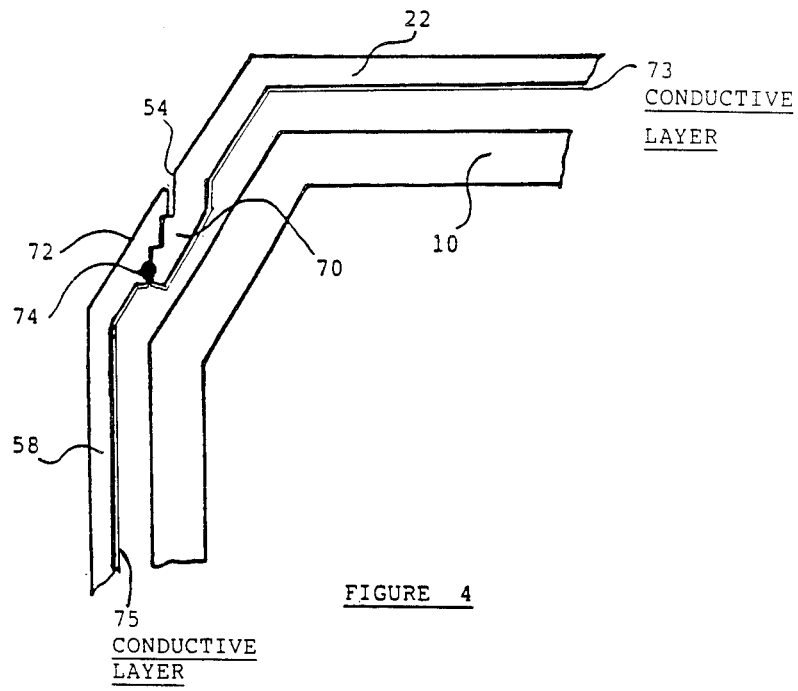
FIG. 4 shows the manner in which the front and rear panels each come together with the top panel. The front and rear panels engage the top panel respectively along the front edge of the top panel and the rear edge of the top panel.

FIG. 4 is a cross-sectional view showing the manner in which the front panel 58 joins with the top panel 22 along the front edge 54 of the top panel 22.

The front edge 54 of the top panel 22 is provided with a tip portion 70 which engages a complementary tip portion 72 of the front panel 58. The tip portion 70 of the top panel 22 includes a staircase structure at its extreme end which engages a complementary staircase structure at the extreme end of the tip portion 72 of the front panel 58 such that the top panel 22 provides mechanical support to the front panel 58. The combined action of the arms 62 (FIG. 3) upon ledges or pivots beneath the top panel 22 and the mutually engaging staircase structures in the tip portion 70 of the top panel 22 and the tip portion 72 of the front panel 58 serves to provide a firm support for the front panel 58 on the front edge 54 of the top panel 22, without the front panel 58 being directly attached to the frame 10. The position of the front panel 58 with respect to the front face 42 of the frame 10 is thus defined by the position of the front edge 54 of the top panel 22.

The rear panel 60 is attached to the rear edge 56 of the top panel 22 in a similar manner.

An electrically conductive sealing gasket 74 in the form of a carbon-loaded thin rubber or elastomer cylindrical body of material is held between the tip portion 70 of the top panel 22 and the tip portion 72 of the front panel 58. This sealing gasket 74 not only provides a seal resistant to ingress of liquid, solid and gaseous contaminants, but also assists in mechanical support of the front panel 58 on the front edge 54 of the top panel 22. Further, the sealing gasket 74 allows a degree of mutual movement and variability of position between the top panel 22 and the front panel 58 while maintaining the integrity of the enclosure. The mutually engaging staircase structure on the tip portions 70,72 also permits such movement.

A staircase structure of similar type is also provided on the front base panel 40 and the lower edge 76 of the front panel 58 such that the front panel 58 is supported both at the top and bottom by such a staircase structure which includes an electrically conductive sealing gasket 74. The rear panel 60 is similarly provided with staircase structures and the rear base panel 44 also has a complementary structure.

The top panel 22 is provided with an electrically conductive layer 73 on its inner surface similar to the electrically conductive layer 39 provided on the side panel 16. The electrically conductive layer 73 extends right up through the tip portion 70 of the top panel 22 and is in electrical contact with the sealing gasket 74. The electrically conducting layer 73 on the inner surface of the top panel 22 stops at the sealing gasket 74.

The front panel 58 is similarly coated with a conductive layer 75 like the conductive layer 73 on the top panel 22 and the conductive layer 39 on the side panel 16 which also has electrical contact with the sealing gasket 74 and stops at the sealing gasket 74. The sealing gasket 74 thus provides an electrical connection between the conductive layer 73 on the inner surface of the top panel 22 and the conductive layer 75 on the inner surface of the front panel 58. The rear edge 56 of the top panel 22 is identically affixed to a similar continuous conductive inner surface on the rear panel 60.

The combination of the conductive layers 73, 75 and the sealing gasket 74 provide a continuous electromagnetic shield inside the panels 22,58. The staircase structures on the tip portions 70,72 provide a labyrinthine path between any point on the surface of the top panel 22 or the front or rear panel 58,60 and any point at the electrical potential of the frame 10. It is to be appreciated (with reference to the later description of FIG. 5) that the conductive layer 73 on the inner surface of the top panel 22 is in fact electrically connected to the frame 10. The labyrinthine path provided by the engagement of the staircase structures in the tip portions 70,72 of the top panel 22 and front or rear panels 58,60 also ensures that no straight line path exists between any point exterior to the enclosure and any point at the same electrical potential as the frame 10. Thus, a spark may not jump from the electromagnetic shield or the sealing gasket 74 without having to pass over or through insulating material.

The top 22, side 16, front 58, rear 60, front base 40, and rear base 44 panels are preferably fabricated from a very high insulating material. A suitable material has been found to be glass reinforced polyester. Those skilled in the art will be aware of many other materials which can be so used. The conducting layers 73,75,39 preferably comprise a nickel based metallic paint but may equally well be any conducting material capable of being coated on the inner surface of the panels 22,16,58,60. Other materials can include electrically conductive plastic, carbon coatings, aluminium or other metal foil and so on.

FIG. 5 is a cross-sectional view, taken along the line X—X' shown in FIG. 3 looking in the direction of the arrows, and showing the relationship between the side panel, 16, the top panel 22 and the frame 10.

An electrically conductive top panel support gasket 78 similar in construction and material to the sealing gasket 74 allows the top panel 22 to rest upon the top face 24 of the frame 10 proximate to the top side edges 30 of the frame 10 and provides electrical connection between the electrically conductive layer 73 on the inner surface of the top panel 22 and the frame 10. Likewise, an electrically conductive side panel support gasket 80 (again in the form of rubber or other elastic or elastomeric material similar to the sealing gasket 74 and the top cover support gasket 78) supports the side panel 16 against the side face 14 of the frame 10 and provides electrical connection between the conductive layer 39 on the side panel 16 and the frame 10. The side panel support gasket 80 is provided with a standoff arm or ledge 82. The side edge 28 of the top panel 22 descends between the top edge portion 48 of the side panel 16 and the top side edge 30 of the frame 10 to reach a point close to the standoff arm or ledge 82. The support gaskets 78,80 extend along the entire length of the frame 10. The combination of the shielding action of the top edge portion 48 of the side panel 16, the shielding action of the side edge 28 of the top panel 22 and of the two gaskets 78,80 acting against the frame 10 provide further protection against the ingress of foreign matter in the form of solids, liquids or vapors.

The top panel support gasket 78 and the side panels support gasket 80 leave an exposed region 77 of the frame 10 not surrounded by any conductive layer 73,39,75. The gaskets 78,80 contact the frame 10 all around their respective faces 24,14,42,46 of the frame 10. The conductive coatings or layers 39,73,75 cover the entire surfaces on the inside of their respective panels 16,22,58,60. There is thus a continuous electrical seal against ingress or egress of electromagnetic radiation. The exposed region 77 of the frame 10 is electrically continuous. The condition in which there is no break in the exposed region 77, allows radiation or re-radiation, ingress or egress of electromagnetic energy. Since no break is provided in the layers 39,73,75, the electromagnetic shielding is complete when the layers 39,73,75 electrically cojoin with the exposed region 77.

The side edge 28 of the top panel 22 forms a first insulating shield over the exposed region 77. The top edge portion 48 of the side panel 16 in turn forms a further electrically insulating shield over the side edge 28 of the top panel 22. The exposed region 77 is thus doubly shielded by the tip portions of edges 28,48 respectively of the top panel 22 and the side panel 16. Thus, once again a labyrinthine path over insulating material is provided to the outer surface of the enclosure. No straight line path is provided between any point at the same electrical potential as the frame 10 and any point external to the enclosure which does not have to pass through or over a considerable body of insulating material.

Figure 6:
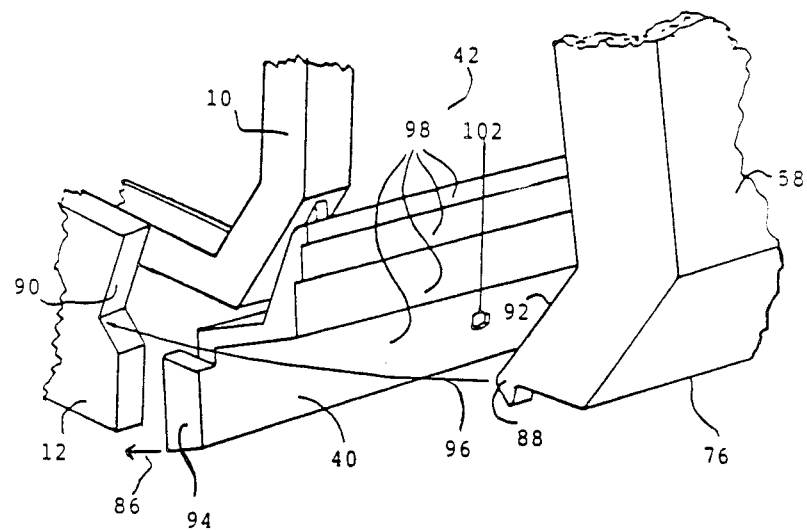
FIG. 6 shows the mannner in which either the front or rear panel and the front or rear base panel of the enclosure are brought together to complete assembly of the enclosure.

FIG. 6 shows the manner in which the lower edge 76 of the front panel 58 is attached to the front base panel 40 in cooperation with the side base panel 12.

It should be understood that the rear panel 60 is attached to the rear face 46 of the frame 10 employing the rear base panel 44 and the side base panel 12 in just the same manner. It should be further understood that while FIG. 6 shows just one side of the lower edge 76 of the front panel 58, the other side is held in exactly the same manner as hereinafter described.

Each side of the front base panel 40 and of the rear base panel 44 is provided with a leg 84 (also shown in FIG. 1) which fits into an aperture in the frame 10 on either side of the front 42 or rear 46 face. The aperture forms a void and the leg 84 engages the edges or extremities of the void to allow the front base panel 44 to swing as indicated by the arrow 86. The leg 84 also provides support for the front base panel 40 on the frame 10.

The lower edge 76 of the front panel 58 is provided at its extremity with a projection 88. While the projection 88 is only required to perform the function hereinafter described, it is preferred that the projection 88 should be identical with the arm 62 so that the front panel 58 may be mounted upon the front face 42 of the frame 10 either way up.

The side base panel 12 includes a recess 90 which accepts the leading edge 92 of the lower edge 76 of the front panel 58. The front base panel 40 includes a clamp member 94 operative to trap the projection 88 in the recess 90 to hold the front panel 58 in position.

Figure 7:
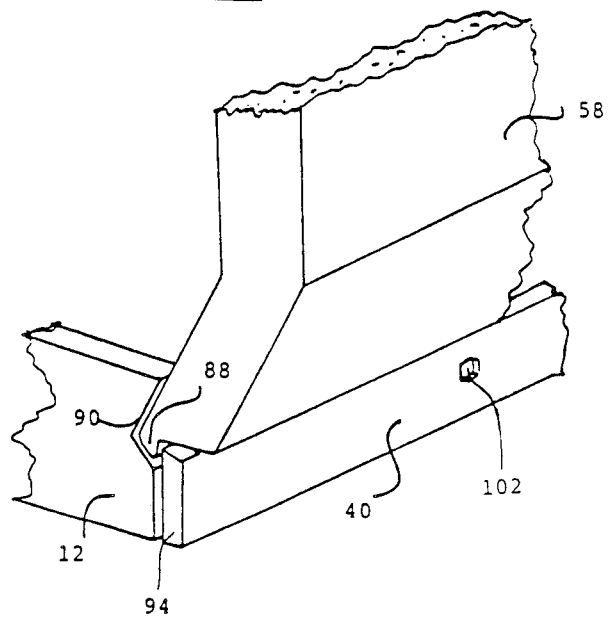
FIG. 7 shows the elements of FIG. 6 in the finally assembled position.

With reference both to FIG. 6 and FIG. 7, the arm 62 on the top edge 64 of the front panel 58 having been inserted into the gaps 68, the front panel 58 is swung as indicated by the arrow 96 such that the projections 88 enter the recess 90 in the side base panel 12, all the time with the front base panel 40 as indicated in FIG. 6 at an angle to its final position such that the clamp member 94 allows passage of the projection 88 into the recess 90 while the leg 84 is in its aperture or void in the frame 10. Thereafter, the front base panel 40 is rotated as indicated by the arrow 86. The clamp member 94 comes up behind the projection 88 and traps the projection 88 in the recess 90 to hold the front panel 58 in position. In entering that position, a further staircase structure 98 (also comprising a gasket) engages its complementary staircase structure (not shown in FIG. 6) in the lower edge 76 of the front panel 58 to provide mechanical support as generally indicated in FIG. 4.

The front base panel 40 is provided with a locking device 102 which also includes a portion (not shown) mounted on the frame 10. The locking device 102 can be of any type. It is preferably a simple mechanical key operated lock or a quick release screw device. In this manner the front base panel 40 may be quickly fixed in place and, if dismantling of the enclosure is required, swung back into the position indicated in FIG. 6 ready to allow disassembly of the enclosure.

When the enclosure is assembled, the front panel 58 rests between the front edge portions 50 of the side panels 16 and the rear panel 60 rests between the rear edge portions 52 of the side panels 16. The separation of the side panels 16 can be defined by engagement of the front edge portions and rear edge portions 50, 52 of the side panels 16 with the edges of the front and rear panels 58,60. The overall dimensions of the completed enclosure are thus defined by the mutual engagement of the panels 12, 16, 22, 40, 58, 60 and the frame 10 and can be in a range of possible positions within the enclosure depending upon the build up of mechanical tolerances between the frame 10 and the panels 16, 22, 40, 44 58, 60 and between the panels 16, 22, 40, 44, 58, 60 themselves. For example, if the top panel 22 is particularly wide, the separation between the side panels 16 will be decided by the width of the top panel 22. On the other hand, if the top panel 22 is narrower than its specified dimension and the front or rear panel 58, 60 is the widest, the overall width of the enclosure and the separation between the side panels 16 will be determined by the width of the widest panel 22, 58, 60.

Likewise, if the top panel 22 is longer than its specified dimension, because the front panel 58 and the rear panel 60 are attached to the top panel 22 alone at their respective top edges 64, 66, the front panel 58 will adopt a position spaced from the front face 42 of the frame 10 (the gasket 74 filling any gap between the front panel 58 and the front face 42) and the overall dimensions of the enclosure front to rear will be determined by the length of the top panel 22. The manner of attachment of the lower edge 76 of the front panel 58 (and of the rear panel 60) as shown in FIGS. 6 and 7 allows a degree of angular tolerance in the position of the front panel 58 since only the lower edge 76 is attached. The front panel 58 is therefore able to accommodate the above described tolerances in length of the top panel 22.

The preferred use of the enclosure is for housing data processing equipment including data processors, disk drives, communications devices, power supplies, fans, blowers and the like. It is however to be appreciated that other electronic devices can be housed in such an enclosure. Examples of such other equipment include radio sets and measuring instruments. Likewise, electrically noisy equipment using electric motors, waveform generators and the like can be housed.

The frame 10 preferably is mounted upon castors (not shown) and the side base panels 12 and the front 40 and rear 44 base panels together form a plinth allowing the castors freedom to roll while providing visual concealment. If the castors are omitted, the plinth so formed is the overall support for the frame 10 together with concealed feet in place of the castors.

It should further be appreciated that the frame 10 can include a base panel for providing an insulated and enclosed support on its lower face. The base panel will be of similar construction to the top panel 22, being insulated on its outer surface, having labyrinthine path-generating tip portions, and conductively coated on its inner surface at the same electrical potential as the frame 10.

I claim:

1. An equipment enclosure comprising;
   an electrically conductive frame having first and second faces in abutment along a first common edge;
   a first panel on said first face, said first panel having an electrically conducting inner surface and an electrically insulating outer surface, said inner surface of said first panel electrically coupled to said frame;
   a second panel on said second face, said second panel having an electrically conducting inner surface and an electrically insulating outer surface, said inner surface of said second panel electrically coupled to said frame;
   a first tip portion on said first panel, said first tip portion proximate to said first common edge;
   a second tip portion on said second panel, said second tip portion proximate to said first common edge;
   said electrically conducting inner surface of said first panel and said electrically conducting inner surface of said second panel each stopping short of said first common edge, thereby leaving an exposed region of said frame; wherein said first tip portion is a first electrically insulating shield, said first shield positioned over said exposed region; and wherein said second tip portion is a second electrically insulating shield, said second shield positioned over said first tip portion.

2. An enclosure according to claim 1 comprising a first electrically conductive support gasket between said inner surface of said first panel and said frame, said second panel having a standoff arm on said inner surface thereof, said standoff arm having an extremity proximate to said frame, a second electrically conductive support gasket between said extremity of said standoff arm and said frame, wherein said first and second electrically conductive support gaskets provide the electrical coupling of the inner surfaces of said first and second panels to said frame.

3. An enclosure according to claim 2 wherein each said support gasket is a carbon loaded elastomer gasket.

4. An enclosure according to claim 1 further characterized in that said electrically conductive frame has a third face in abutment with said first face along a second common edge;
   a third panel on said third face, said third panel having an electrically conducting inner surface and an electrically insulating outer surface, said inner surface of said third panel electrically coupled to said frame;
   a third tip portion on said first panel, said third tip portion proximate to said second common edge;
   a fourth tip portion on said third panel, said fourth tip portion proximate to said second common edge;
   said inner surface of said first panel and said inner surface of said third panel being electrically joined by an electrically conductive sealing gasket, said sealing gasket between and in contact with both said third tip portion and said fourth tip portion.

5. An enclosure according to claim 4 wherein said first panel is a glass reinforced polyester panel.

6. An enclosure according to claim 4 wherein said sealing gasket is a carbon loaded elastomer gasket.

7. An enclosure according to claim 4 wherein said third tip portion comprises a first staircase structure; wherein said fourth tip portion comprises a second staircase structure of complementary outline to that of said first staircase structure; and wherein said first and second staircase structures together form a labyrinthine path.

8. An enclosure according to claim 7 wherein said first and second staircase structures are cooperative to support said first panel on said third panel.

9. An enclosure according to claim 4 wherein:
   said electrically conducting inner surface of said first panel comprises a first electrically conductive coating, said first coating continuing onto an inner surface of said third tip portion, around the distal end of said third tip portion and onto an outer surface of said third tip portion, said first coating terminating at and in contact with said electrically conductive sealing gasket; and
   said electrically conducting inner surface of said third panel comprises a second electrically conductive coating, said second coating continuing onto an inner surface of said fourth tip portion, said second coating terminating at and in contact with said electrically conductive sealing gasket.

10. An enclosure according to claim 9 wherein said electrically conductive coating comprises a layer of nickel based paint.

11. An enclosure according to claim 4 wherein:
    said frame is generally cubical in shape.

* * * * *